（12） United States Patent
Itakura et al.

(10) Patent No.: US 9,355,283 B2
(45) Date of Patent: May 31, 2016

(54) INTEGRATION CIRCUIT

(71) Applicant: KABUSHIKI KAISHA TOSHIBA, Minato-ku, Tokyo (JP)

(72) Inventors: Tetsuro Itakura, Nerima Tokyo (JP); Masanori Furuta, Odawara Kanagawa (JP); Shunsuke Kimura, Kawasaki Kanagawa (JP); Hideyuki Funaki, Shinagawa Tokyo (JP); Go Kawata, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/720,640

(22) Filed: May 22, 2015

(65) Prior Publication Data
US 2015/0349753 A1    Dec. 3, 2015

(30) Foreign Application Priority Data

May 30, 2014    (JP) .................................. 2014-113206

(51) Int. Cl.
*G06G 7/184*    (2006.01)
*H03K 4/502*    (2006.01)
*H03M 1/00*    (2006.01)

(52) U.S. Cl.
CPC ................ *G06G 7/184* (2013.01); *H03K 4/502* (2013.01); *H03M 1/00* (2013.01)

(58) Field of Classification Search
CPC ........... G06G 7/18; G06G 7/184; H03M 1/00; H03M 1/12
USPC .................................. 327/104, 336, 337, 339
See application file for complete search history.

(56) References Cited

U.S. PATENT DOCUMENTS

| 8,988,267 B1 | 3/2015 | Kimura et al. |
| 2015/0085985 A1 | 3/2015 | Funaki et al. |
| 2015/0130538 A1 | 5/2015 | Itakura et al. |

(Continued)

FOREIGN PATENT DOCUMENTS

| JP | 2001-257593 | 9/2001 |
| JP | 2015-065531 | 4/2015 |

(Continued)

OTHER PUBLICATIONS

U.S. Appl. No. 14/561,705, filed Dec. 5, 2014, Furuta, et al.

(Continued)

*Primary Examiner* — William Hernandez
(74) *Attorney, Agent, or Firm* — Knobbe, Martens, Olson & Bear, LLP

(57) ABSTRACT

An integration circuit according to one embodiment includes a first capacitance element, a capacitance circuit, a comparison circuit, a memory circuit and an operation circuit. The first capacitance element receives a current signal. The capacitance circuit includes a first switch and a second capacitance element, and is connected in parallel to the first capacitance element. The second capacitance element receives a current signal via the first switch. The comparison circuit compares a voltage of the first capacitance element with a reference voltage to obtain a comparison result. The memory circuit stores the comparison result, and opens or closes the first switch based on the comparison result. The operation circuit outputs a residual signal based on a difference between the integrated value obtained by the first capacitance element and the second capacitance element and a value based on the comparison result.

9 Claims, 12 Drawing Sheets

(56) References Cited

U.S. PATENT DOCUMENTS

| | | |
|---|---|---|
| 2015/0137858 A1 | 5/2015 | Itakura et al. |
| 2015/0160677 A1 | 6/2015 | Furuta et al. |
| 2015/0270840 A1 | 9/2015 | Itakura et al. |

FOREIGN PATENT DOCUMENTS

| | | |
|---|---|---|
| JP | 2015-065532 | 4/2015 |
| JP | 2015-095830 | 5/2015 |
| JP | 2015-100036 | 5/2015 |
| JP | 2015-115654 | 6/2015 |
| JP | 2015-184119 A1 | 10/2015 |
| JP | 2015-194457 | 11/2015 |
| WO | WO 2015/146595 A1 | 10/2015 |

OTHER PUBLICATIONS

U.S. Appl. No. 14/636,593.
U.S. Appl. No. 14/528,196.
U.S. Appl. No. 14/540,059.
A. Nascetti, et al. "High Dynamic Range Current-to-Digital Readout Electronics for Lab-on-Chip aaplications", IEEE, $4^{TH}$ International Workshop on Advances in Sensors and Interfaces, 2011.
A. Dragone, et al. eLine10k: a High Dynamic Range Front-End ASIC for LCLS Detectors, IEEE Nuclear Science Symposium and Medical Imaging conference Record, 2012.

INTEGRATION CIRCUIT

CROSS REFERENCE TO RELATED APPLICATION(S)

This application is based upon and claims the benefit of priority from the prior Japanese Patent Application No. 2014-113206, filed on May 30, 2014, the entire contents of which are incorporated herein by reference.

FIELD

Embodiments described herein relate generally to an integration circuit.

BACKGROUND

A conventional A/D convertor separately has an integration circuit for integrating a current signal and an A/D conversion circuit for performing A/D conversion on an integrated value obtained by the integration circuit, which has caused a problem of an increase in circuit scale. In order to suppress such an increase in circuit scale, there has been proposed an integration circuit provided with an A/D conversion function.

As the conventional integration circuit provided with the A/D conversion function, there has been proposed an integration circuit that compares an integrated value with a predetermined threshold while integrating a current signal, and discards the integrated value every time it reaches a threshold, to realize A/D conversion of the current signal based on the number of times the integrated value has reached the threshold.

However, in such an integration circuit, a delay in operation of a comparison circuit for comparing the integrated value and the threshold leads to a delay in discarding the integrated value or makes it impossible to integrate a current signal during a period for discarding the integrated value, and there has thus been a problem of deterioration in accuracy in A/D conversion. Further, in order to prevent ringing of an output at the time of discarding the integrated value and an erroneous operation of a comparator due to a slow response, a high-speed amplifier with a large phase margin is required, and there has thus been a problem of an increase in power consumption.

DETAILED DESCRIPTION

Embodiments will now be explained with reference to the accompanying drawings. The present invention is not limited to the embodiments.

An integration circuit according to one embodiment includes a first capacitance element, a capacitance circuit, a comparison circuit, a memory circuit and an operation circuit. The first capacitance element receives a current signal. The capacitance circuit includes a first switch and a second capacitance element, and is connected in parallel to the first capacitance element. The second capacitance element receives a current signal via the first switch. The comparison circuit compares a voltage of the first capacitance element with a reference voltage to obtain a comparison result. The memory circuit stores the comparison result and opens or closes the first switch based on the comparison result. The operation circuit outputs a residual signal based on a difference between the integrated value obtained by the first capacitance element and the second capacitance element and a value based on the comparison result stored in the memory circuit.

First Embodiment

Figure 1:
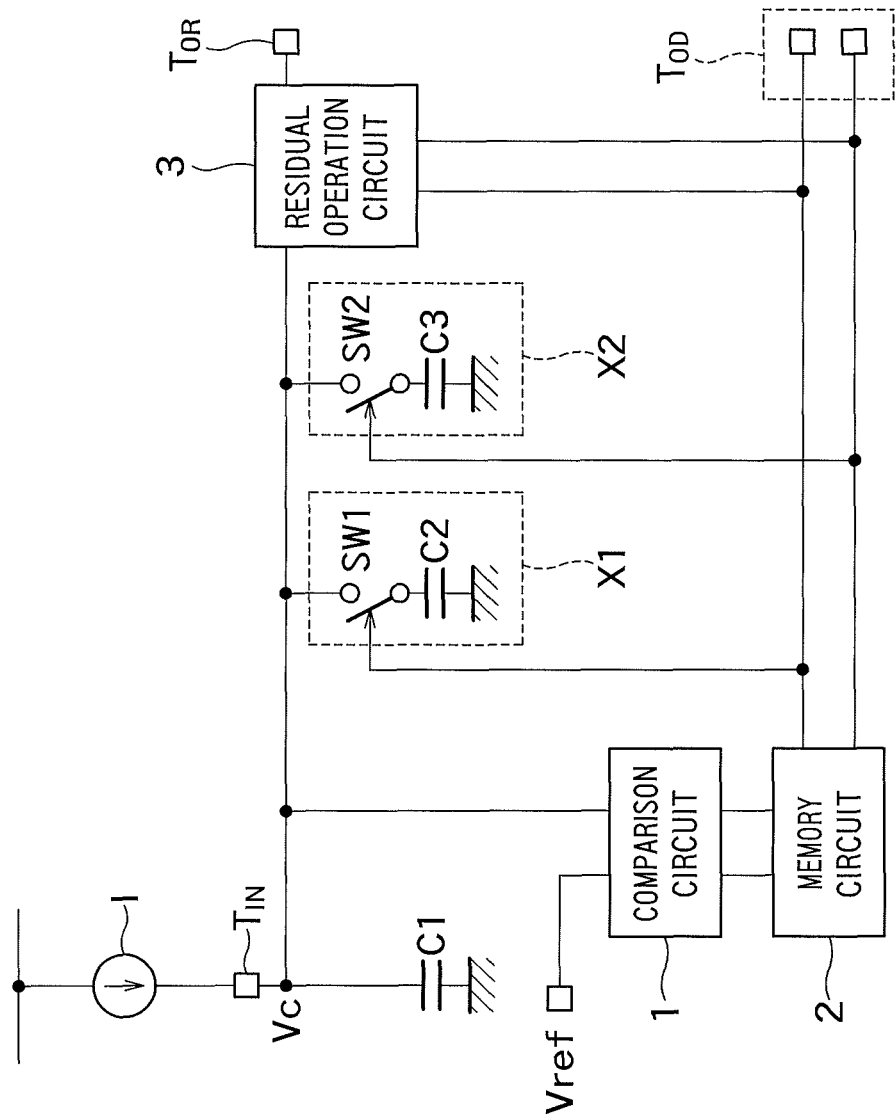
FIG. 1 is a schematic constitutional view showing an integration circuit according to a first embodiment.

First, an integration circuit according to the first embodiment will be described with reference to FIGS. 1 and 2. FIG. 1 is a schematic constitutional view showing the integration circuit according to the present embodiment. As shown in FIG. 1, the integration circuit according to the present embodiment is provided with an input terminal $T_{IN}$, a capacitance element C1, capacitance circuits X1, X2, a comparison circuit 1, a memory circuit 2, a residual operation circuit 3, a residual output terminal $T_{OR}$, and a digital output terminal $T_{OD}$.

The input terminal $T_{IN}$ is connected to a current source I, and receives an input of a current signal $I_{SIG}$ from the current source I. The current signal $I_{SIG}$ irregularly or regularly includes a signal component.

One end of the capacitance element C1 (first capacitance element) is connected to the input terminal $T_{IN}$, and the other end thereof is connected to a ground. The capacitance element C1 receives an input of the current signal $I_{SIG}$ from the current source I, and stores an electric charge based on the current signal $I_{SIG}$. Hereinafter, a voltage, which is generated at one end (high-voltage side terminal) of the capacitance element C1 by storing an electric charge, is referred to as a voltage Vc.

The capacitance circuit X1 is connected in parallel to the capacitance element C1, and is provided with a switch SW1 and a capacitance element C2. The switch SW1 (first switch) is connected to between the capacitance element C1 and the capacitance element C2. One end of the capacitance element C2 (second capacitance element) is connected to the switch SW1, and the other end thereof is connected to the ground. The capacitance element C2 receives an input of the current signal $I_{SIG}$ from the current source I via the switch SW1, and stores an electric charge based on the current signal $I_{SIG}$.

The capacitance circuit X2 is connected in parallel to the capacitance element C1, and is provided with a switch SW2 and a capacitance element C3. The switch SW2 is connected to between the capacitance element C1 and the capacitance element C3. One end of the capacitance element C3 is connected to the switch SW2, and the other end thereof is connected to the ground. The capacitance element C3 receives an input of the current signal $I_{SIG}$ from the current source I via the switch SW2, and stores an electric charge based on the current signal $I_{SIG}$.

The comparison circuit 1 receives inputs of the voltage Vc of the capacitance element C1 and a reference voltage Vref, compares the voltage Vc and the reference voltage Vref, and outputs a signal based on a comparison result. Specifically, the comparison circuit 1 outputs H (High) every time the voltage Vc and the reference voltage Vref agree, and in other cases, the comparison circuit 1 outputs L (Low). H and L may be reversed.

The reference voltage Vref is a predetermined constant voltage, and is set lower than the voltage Vc at the time of input of a maximum current signal $I_{SIG}$ which is expected to be inputted into this integration circuit. The voltage Vc at the time of input of the maximum current signal $I_{SIG}$ is hereinafter referred to as a voltage $V_{MAX}$ ($V_{MAX}$>Vref).

The memory circuit 2 stores the signal based on the comparison result from the comparison circuit 1, namely H or L, to store the comparison result (H or L) of the comparison circuit 1, and controls opening/closing of the switches SW1, SW2 by means of an opening/closing signal based on the stored comparison result. In this integration circuit, since there is performed 1.5-bit A/D conversion based on results of comparison performed twice, the memory circuit 2 respectively stores a first comparison result (H or L) and a second comparison result (H or L). The memory circuit 2 opens or closes the switch SW1 based on the first comparison result, and opens or closes the switch SW2 based on the second comparison result.

Hereinafter, it is assumed that the switches SW1, SW2 are turned on when the memory circuit 2 outputs H as the opening/closing signal, and the switches SW1, SW2 are turned off when the memory circuit 2 outputs L as the opening/closing signal. Further, it is assumed that, when an n-th comparison result is H(L), the memory circuit 2 outputs H(L) as the opening/closing signal. A method for controlling the switches SW1, SW2 by the memory circuit 2 will be described later.

The comparison result stored in the memory circuit 2 is outputted from the digital output terminal $T_{OD}$ as a digital signal obtained by the A/D conversion. As shown in FIG. 1, this integration circuit is provided with two digital output terminals $T_{OD}$. The first comparison result (H or L) is outputted from the one terminal, and the second comparison result (H or L) is outputted from the other terminal.

The residual operation circuit 3 outputs, from the residual output terminal $T_{OR}$, a voltage $V_R$ based on a difference between the integrated value obtained by the capacitance elements C1 to C3 and the integrated value based on the comparison result (digital signal) stored in the memory circuit 2 as a residual signal after the A/D conversion by this integration circuit. The residual calculation by the residual operation circuit 3 may, for example, be performed by calculating a difference between the electric charges stored in the capacitance elements C1 to C3 and the electric charge based on the comparison result, or be performed by calculating a difference between the voltage Vc and the voltage based on the comparison result.

Next, an operation of the integration circuit according to the present embodiment will be described. It is to be noted that in the integration circuit before starting its operation, the switches SW1, SW2 are off, and no electric charge is stored in the capacitance elements C1, C2, C3.

First, when the current signal $I_{SIG}$ is inputted from the input terminal $T_{IN}$ into this integration circuit, an electric charge based on the current signal $I_{SIG}$ is stored into the capacitance element C1, and the voltage Vc of the capacitance element C1 increases. The comparison circuit 1 compares the voltage Vc and the reference voltage Vref, and when the voltage Vc agrees with the reference voltage Vref (Vc=Vref), the comparison circuit 1 outputs H as a signal based on a comparison result. When receiving an input of H, the memory circuit 2 stores the first comparison result as H, and outputs H to the switch SW1. Thereby, the switch SW1 is turned on.

When the switch SW1 is turned on, the capacitance element C1 and the capacitance element C2 are connected in parallel. Therefore, the electric charge stored in the capacitance element C1 is instantaneously redistributed between the capacitance elements C1 and C2, and voltages of the capacitance elements C1, C2 become equal. When the capacitances of the capacitance elements C1, C2 are represented by C1 and C2, the voltage Vc after turning-on of the switch SW1 becomes: Vref×C1/(C1+C2), which is lower than the reference voltage Vref.

Subsequently, the electric charge based on the current signal $I_{SIG}$ is stored into the capacitance elements C1, C2, and the voltage Vc increases again. The comparison circuit 1 compares the voltage Vc and the reference voltage Vref, and when the voltage Vc agrees with the reference voltage Vref (Vc=Vref), the comparison circuit 1 again outputs H as a signal based on a comparison result. When receiving an input of H, the memory circuit 2 stores H as the second comparison result, and outputs H to the switch SW2. Thereby, the switch SW2 is turned on.

When the switch SW2 is turned on, the capacitance elements C1, C2 and the capacitance element C3 are connected in parallel. Therefore, the electric charges stored in the capacitance elements C1, C2 are instantaneously redistributed among the capacitance elements C1 to C3, and voltages of the capacitance elements C1 to C3 become equal. The voltage Vc after turning-on of the switch SW2 becomes: Vref×(C1+C2)/(C1+C2+C3), which is lower than the reference voltage Vref.

Subsequently, the electric charge based on the current signal $I_{SIG}$ is stored into the capacitance elements C1 to C3, and the voltage Vc increases again.

When the integration of the current signal $I_{SIG}$, namely the storage of the electric charge based on the current signal $I_{SIG}$, is completed, the memory circuit 2 outputs the stored comparison result from the digital output terminal $T_{OD}$ as a digital signal obtained by the A/D conversion of the current signal $I_{SIG}$. Thereafter, the memory circuit 2 resets the stored comparison result.

Further, the residual operation circuit 3 outputs, from the residual output terminal $T_{OR}$, the voltage $V_R$ based on a difference between the integrated value obtained by the capacitance elements C1 to C3 and the integrated value based on the comparison result as a residual signal.

As described above, the integration circuit according to the present embodiment can perform the A/D conversion on an integrated value while integrating the current signal $I_{SIG}$. Hence the use of this integration circuit allows reduction in circuit scale of an A/D converter.

Further, in this integration circuit, the current signal $I_{SIG}$ is integrated while the capacitance elements C2, C3 are added as integration capacitors. Therefore, even when turning-on of the switches SW1, SW2 is delayed due to a delay in the comparison circuit 1 or the memory circuit 2, the current signal $I_{SIG}$ for the delay time is stored into the capacitance elements C1 to C3. Hence this integration circuit can suppress an influence on the integrated value by the delay in operation of the comparison circuit 1 or the memory circuit 2, so as to realize highly accurate A/D conversion.

Further, in this integration circuit, the integrated value is not discarded during the A/D conversion, and a decrease in voltage Vc is realized by redistribution of the electric charge between the capacitance elements. That is, extraction (resetting) of the electric charge stored in each capacitance element is not performed during the A/D conversion. This eliminates the need for a high-speed amplifier with a large phase margin, thus allowing reduction in power consumption.

It is to be noted that, although the two capacitance circuits are provided in the integration circuit in the present embodiment, this is not restrictive, and there can also be formed a configuration provided with one capacitance circuit or three or more capacitance circuits. Generally, in a case where N ($1 \leq N$) capacitance circuits are provided in the integration circuit, a capacitance circuit n ($1 \leq n \leq N$) is connected in parallel to the capacitance element C1 and is provided with a switch SWn (first switch) and a capacitance element Cn+1 (second capacitance element), and the current signal $I_{SIG}$ is inputted into the capacitance element Cn+1 via the switch SWn.

Then, the memory circuit 2 stores an n-th comparison result (H or L) and opens or closes the switch SWn based on the n-th comparison result. When the n-th comparison result is H(L), the memory circuit 2 outputs H(L) as the opening/closing signal, and turns on (off) the switch SWn. During the integration of the current signal $I_{SIG}$, the integration circuit repeats a similar operation while increasing n by 1, to integrate the current signal $I_{SIG}$ and perform the A/D conversion thereon.

Figure 2:
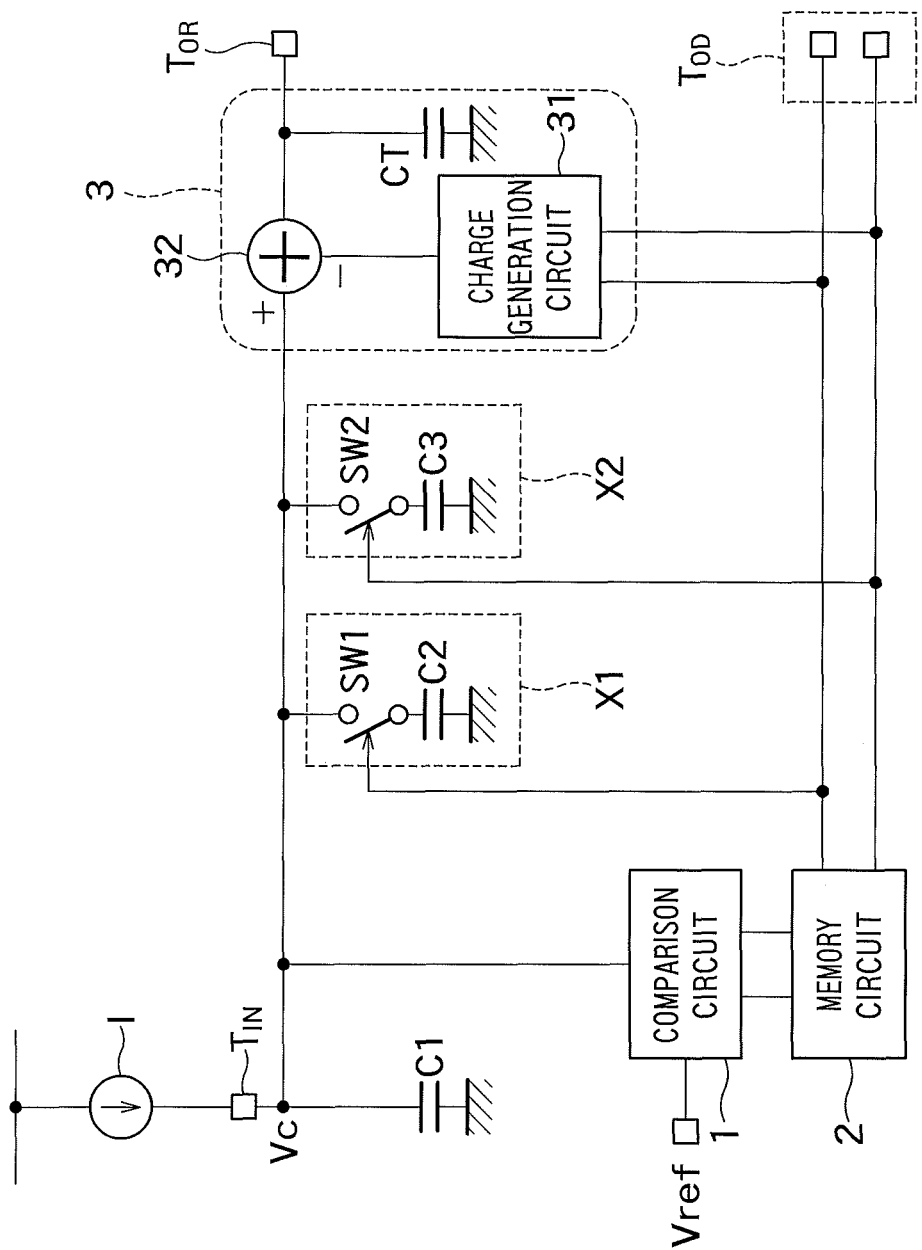
FIG. 2 is a schematic constitutional view showing one example of a residual operation circuit of FIG. 1.

Here, FIG. 2 is a schematic constitutional view showing one example of the residual operation circuit 3. The residual operation circuit 3 of FIG. 2 calculates a difference between the electric charges stored in the capacitance elements C1 to C3 and the electric charge based on the comparison result, thereby to generate a residual signal (voltage $V_R$). As shown in FIG. 2, this residual operation circuit 3 is provided with a charge generation circuit 31, a subtraction circuit 32 and a capacitance element CT.

The charge generation circuit 31 generates an electric charge based on the comparison result stored in the memory circuit 2, and stores the generated charge. The electric charge generated by the charge generation circuit 31 is previously set.

The subtraction circuit 32 subtracts the electric charge generated by the charge generation circuit 31 from the electric charges stored in the capacitance elements C1 to C3, and outputs an electric charge of the difference.

The capacitance element CT (third capacitance element) stores the electric charge outputted by the subtraction circuit 32, and generates a voltage based on the stored electric charge. The voltage $V_R$ of the capacitance element CT generated by storing the electric charge outputted by the subtraction circuit 32 become the residual signal of this integration circuit.

It should be noted that the residual operation circuit 3 of FIG. 2 is just one example, and there can be formed an arbitrary configuration capable of generating a residual signal. Further, for the residual calculation, the voltage Vc may be used in place of the electric charge.

Second Embodiment

Figure 3:
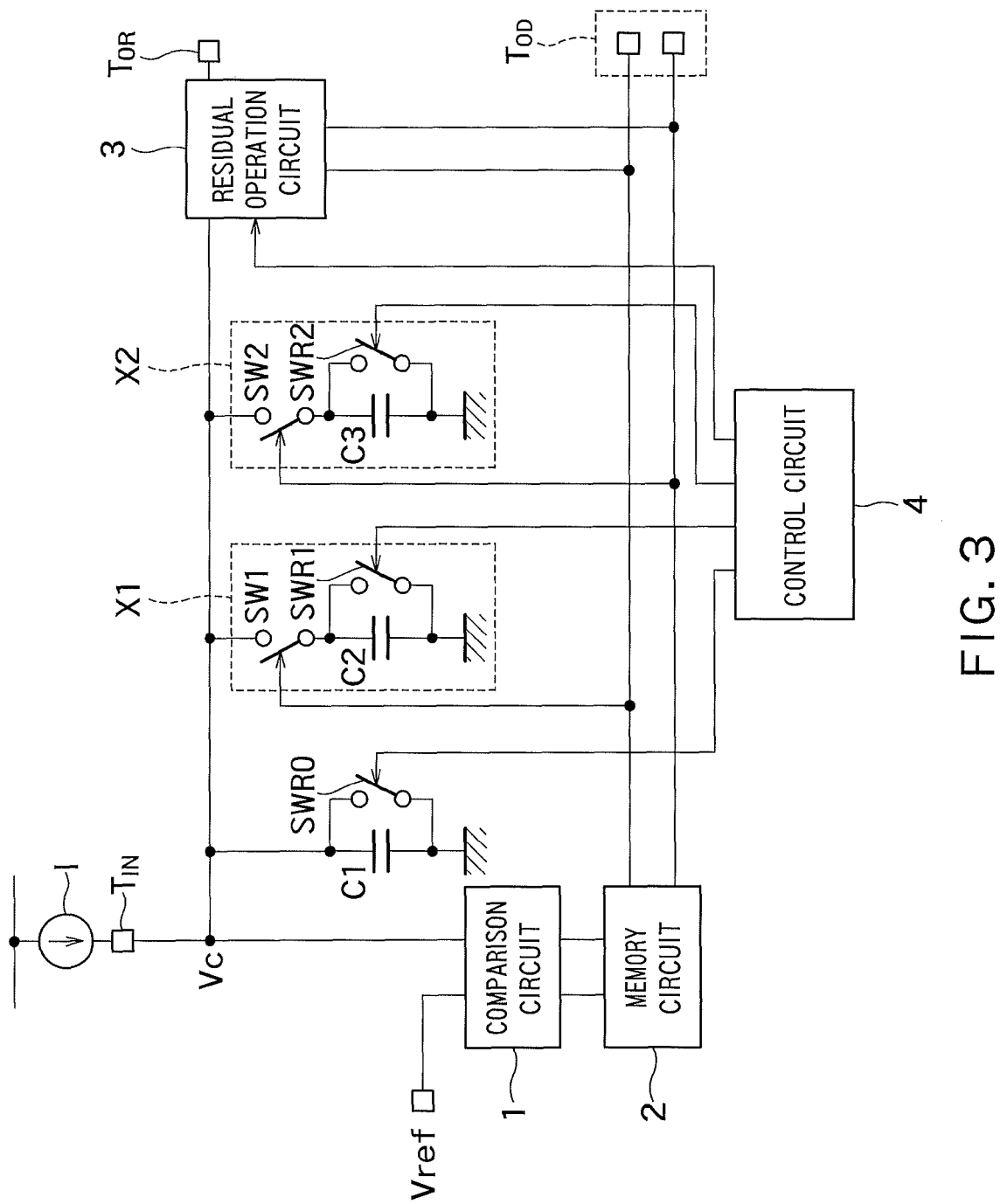
FIG. 3 is a schematic constitutional view showing an integration circuit according to a second embodiment.

Next, an integration circuit according to a second embodiment will be described with reference to FIG. 3. FIG. 3 is a schematic constitutional view showing the integration circuit according to the present embodiment. As shown in FIG. 3, the integration circuit according to the present embodiment is provided with switches SWR0, SWR1, SWR2 and a control circuit 4. The other configurations are similar to those in the first embodiment.

The switches SWR0, SWR1, SWR2 (second switches) are reset switches respectively connected in parallel to the capacitance elements C1, C2, C3. By turning-on of the switches SWR0 to SWR2, the electric charges stored in the capacitance elements C1 to C3 are discharged.

The control circuit 4 controls opening/closing of each of the switches SWR0 to SWR2 by means of an opening/closing signal, and controls the timing for the residual operation circuit 3 to start the residual calculation by means of a residual calculation start signal. It is assumed hereinafter that the residual calculation is started when H is inputted into the residual operation circuit 3 as the residual calculation start signal. It is assumed that the residual calculation start signal becomes H after a predetermined time $t_1$ (first predetermined time) from the start of integration of the current signal $I_{SIG}$, and the opening/closing signals of the switches SWR0 to SWR2 become H after a predetermined time $t_2$ ($>t_1$) from the start of the integration.

It is assumed that in this integration circuit, the switches SWR0 to SWR2 are off at the point of time when the integration of the current signal $I_{SIG}$ is started. When the integration of the current signal $I_{SIG}$ is started in this integration circuit, after the predetermined time $t_1$, the control circuit 4 outputs H as the residual calculation start signal, and the residual operation circuit 3 starts the residual calculation. When the residual calculation is completed and the predetermined time $t_2$ elapses from the start of the integration, the control circuit 4 outputs H as the opening/closing signal, and turns on all the switches SWR0 to SWR2. Thereby, the electric charges stored in the capacitance elements C1 to C3 are discharged, and the capacitance elements C1 to C3 come into the state of being able to integrate the next current signal $I_{SIG}$.

As described above, according to this integration circuit, it is possible to turn on the switches SWR0 to SWR2 after completion of the residual calculation, and discharge the electric charges stored in the capacitance elements C1 to C3. This enables repeated integration of the current signal $I_{SIG}$.

It is to be noted that, when the switch SW1 is off at the time of the integration, the switch SWR1 may not be turned on since an electric charge is not stored in the capacitance element C2. This also applies to the switch SWR2. Such control is made possible by using the comparison result stored in the memory circuit 2.

Third Embodiment

Figure 4:
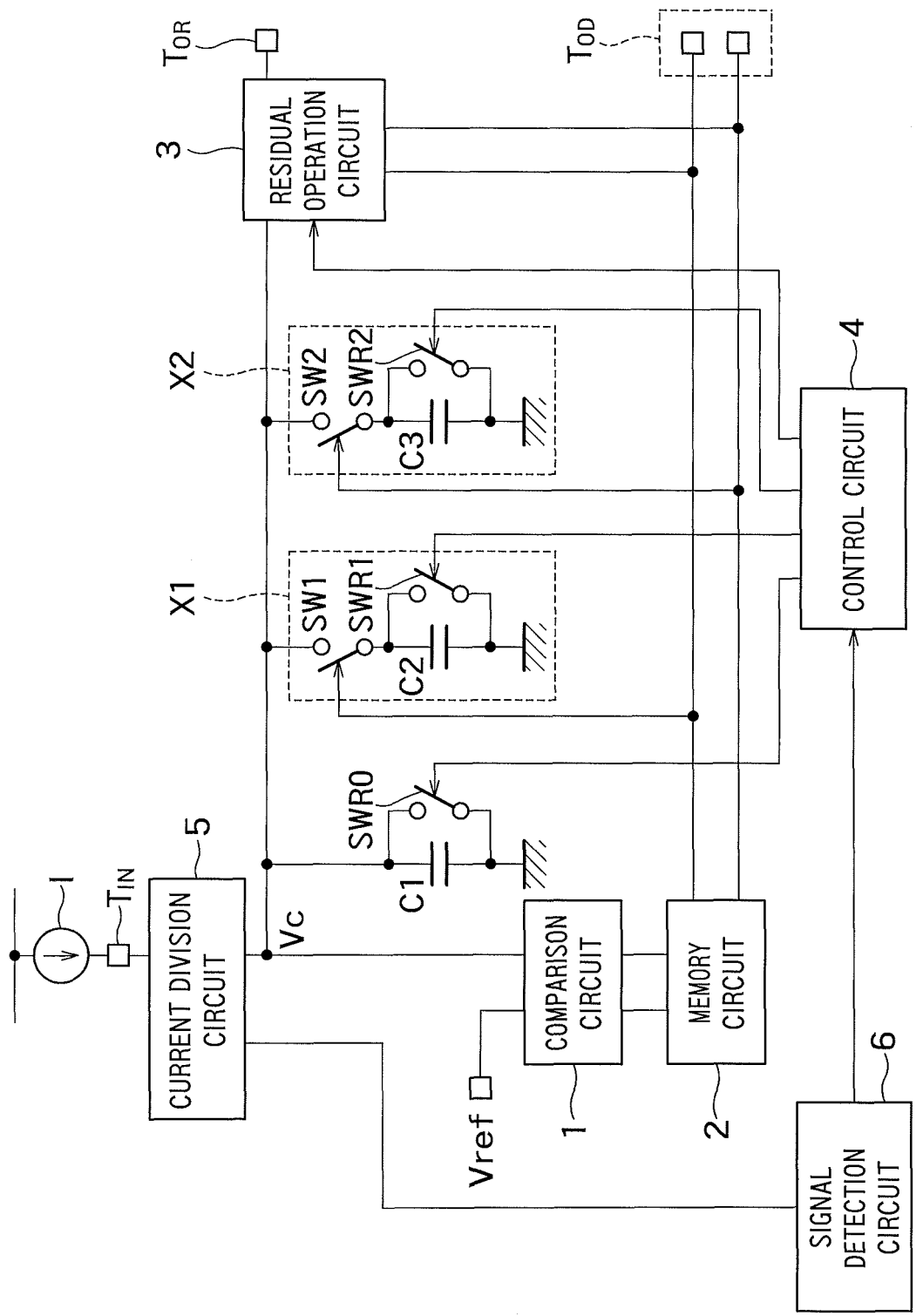
FIG. 4 is a schematic constitutional view showing an integration circuit according to a third embodiment.

Next, an integration circuit according to a third embodiment will be described with reference to FIGS. 4 to 9. FIG. 4 is a schematic constitutional view showing the integration circuit according to the present embodiment. As shown in FIG. 4, the integration circuit according to the present embodiment is provided with a current division circuit 5 and a signal detection circuit 6. The other configurations are similar to those in the second embodiment.

The current division circuit 5 is connected to between the input terminal $T_{IN}$ and the capacitance element C1. The current division circuit 5 divides the current signal $I_{SIG}$ inputted from the current source I, at a predetermined ratio and inputs one of the divided currents into the capacitance elements C1 to C3, while inputting the other current into the signal detection circuit 6. Accordingly, in the present embodiment, the current signal $I_{SIG}$ to be integrated by the integration circuit is the current signal $I_{SIG}$ divided at the predetermined ratio by the current division circuit 5. It should be noted that there can also be formed a configuration provided with a circuit for duplicating the current signal $I_{SIG}$, such as a current mirror circuit, in place of the current division circuit 5.

The signal detection circuit 6 receives an input of the other of the currents divided at the predetermined ratio by the current division circuit 5, and detects a signal component included in the current signal $I_{SIG}$. When detecting the signal component, the signal detection circuit 6 inputs the detection signal into the control circuit 4. In the present embodiment, the timing at which the detection signal is inputted into the control circuit 4 is the timing for starting the integration of the current signal $I_{SIG}$.

In this integration circuit, at the time of no signal, namely in a period when a signal component is not being detected by the signal detection circuit 6, the control circuit 4 outputs H as the opening/closing signal and turns on the switches SWR0 to SWR2. Therefore, the electric charge is not stored in the capacitance elements C1 to C3 and the integration is not performed.

When the signal detection circuit 6 detects a signal component and the detection signal is inputted into the control circuit 4, the control circuit 4 outputs L as the opening/closing signal and turns off all the switches SWR0 to SWR2. Thereby, the integration of the current signal $I_{SIG}$ is started. That is, the detection signal by the signal detection circuit 6 becomes a trigger for starting the integration.

The integration operation thereafter is as described above. The switches SW1, SW2 are sequentially turned on based on the comparison result of the comparison circuit 1, and the current signal $I_{SIG}$ is integrated by the capacitance elements C1 to C3. Then, at the predetermined time $t_1$ after the input of the detection signal, the control circuit 4 allows the residual operation circuit 3 to start the residual calculation, and at the predetermined time $t_2$ after the input of the detection signal, the control circuit 4 turns on all the switches SWR0 to SWR2, to allow the capacitance elements C1 to C3 to perform discharging. After outputting the digital signal, the memory circuit 2 resets the stored comparison result, and turns off the switches SW1, SW2. Thereby, the integration circuit returns to the state at the time of no signal, and becomes able to integrate the next current signal $I_{SIG}$.

As described above, in this integration circuit, the timing for starting the integration operation can be acquired by the signal detection circuit 6 detecting a signal component included in the current signal $I_{SIG}$.

Figure 5:
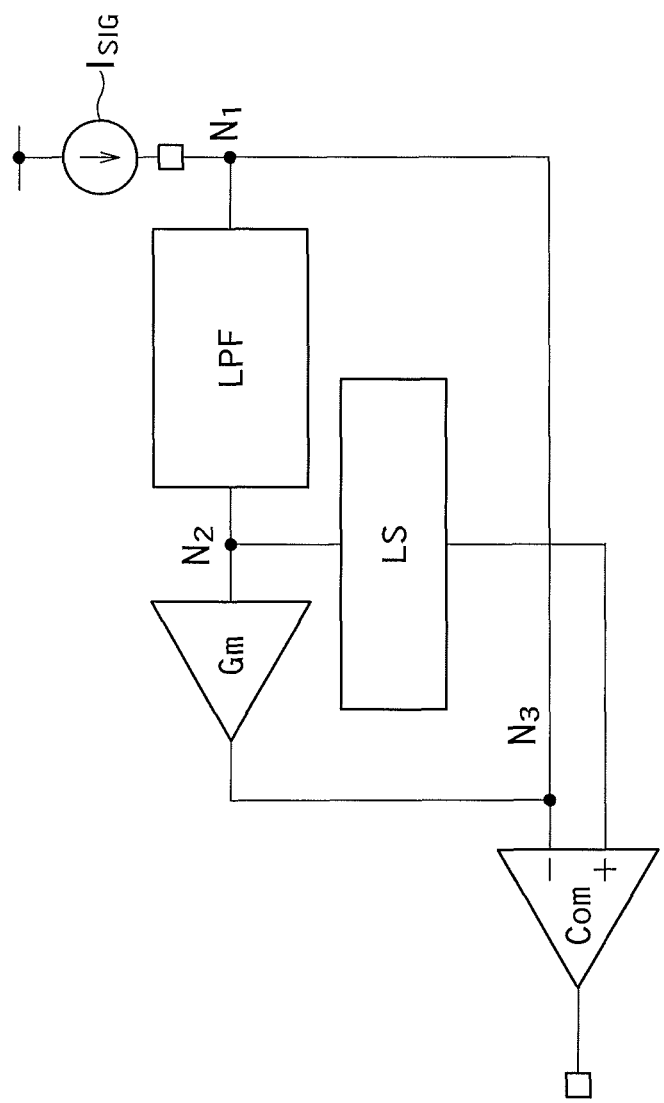
FIG. 5 is a schematic constitutional view showing one example of a signal detection circuit.

Here, FIG. 5 is a diagram showing one example of the signal detection circuit 6 of the integration circuit according to the present embodiment. As shown in FIG. 5, this signal detection circuit 6 is provided with a low-pass filter LPF, a voltage-to-current conversion circuit Gm, a comparator Com and a level shift circuit LS.

An input terminal (first terminal) of the low-pass filter LPF (hereinafter referred to as "filter LPF") is connected to the current division circuit 5, and an output terminal (second terminal) thereof is connected to an input terminal of the voltage-to-current conversion circuit Gm and a positive input terminal of the comparator Com through the level shift circuit LS. The filter LPF allows passage of a low-pass component (low-frequency component) of the current signal $I_{SIG}$ inputted from the current division circuit 5, and attenuates a high-pass component (high-frequency component) thereof. That is, it allows passage of a frequency component not higher than a cutoff frequency as the low-frequency component, and attenuates a frequency component higher than the cutoff frequency as the high-frequency component. The filter LPF may be a first-order filter, or a high-order filter not lower than a second-order filter. Hereinafter, a connection point between the current division circuit 5 and the input terminal of the filter LPF is referred to as a node $N_1$, and a connection point between the output terminal of the filter LPF and the input terminal of the voltage-to-current conversion circuit Gm is referred to as a node $N_2$.

The input terminal (first terminal) of the voltage-to-current conversion circuit Gm (hereinafter referred to as "conversion circuit Gm") is connected to the node $N_2$, and an output terminal (second terminal) thereof is connected to the node $N_1$ and a negative input terminal of the comparator Com. The conversion circuit Gm outputs a current based on the inputted voltage. The conversion circuit Gm is configured of a transistor, for example. Hereinafter, a connection point between the output terminal of the conversion circuit Gm and a negative input terminal of the comparator Com is referred to as a node $N_3$.

The comparator Com is provided with the positive input terminal (first input terminal), the negative input terminal (second input terminal) and an output terminal. The positive input terminal is connected to the node $N_2$, the negative input terminal is connected to the node $N_1$ and the node $N_3$, and the output terminal is connected to the control circuit 4. The comparator Com compares a reference voltage inputted from the positive input terminal and a signal voltage inputted from the negative input terminal, and outputs a signal based on a difference between the reference voltage and the signal voltage. For example, the comparator Com outputs a first signal when the signal voltage is larger than the reference voltage, and outputs a second signal when the signal voltage is smaller than the reference voltage. The comparator Com is configured of an operational amplifier, for example.

The level shift circuit LS is connected to between the node $N_2$ and the positive input terminal of the comparator Com, and inputs into the comparator Com a voltage $V_2$ of the node $N_2$ as increasing it just by a predetermined voltage $V_{th}$. The comparator Com receives an input of a voltage $V_1$ of the node $N_1$ as an input voltage, and receives an input of $V_2+V_{th}$ as a reference voltage.

Next, an operation of this signal detection circuit will be described. Hereinafter, a magnitude of the current signal $I_{SIG}$ is represented by I(s), the voltage of the node $N_1$ is by $V_1(s)$, a voltage of the output terminal of the filter LPF is by $V_2(s)$, a transfer function of the filter LPF is by HLPF(s), a voltage-to-current conversion coefficient of the conversion circuit Gm is by Gm, and output resistance of the conversion circuit Gm is by ro. It is assumed that the output voltage ro is sufficiently larger than a reciprocal (1/Gm) of the voltage-to-current conversion coefficient (ro>1/Gm). When HLPF(s)=1/(1+s/ωc), the signal voltage to be inputted into the negative input terminal of the comparator Com, namely the voltage $V_1$, is expressed by the following expression:

$$V_1(s) = I(s) \cdot ro / (1 + HLPF(s) \cdot Gm \cdot ro) \qquad (1)$$

$$= I(s) \cdot ro \cdot (1 + s/\omega c) / (1 + Gm \cdot ro + s/\omega c)$$

In Expression (1) above, ωc is a cutoff frequency of the filter LPF, and s is a Laplace variable. It is found from Expression (1) that the low-pass component of the current signal $I_{SIG}$ is converted to the voltage $V_1$ by a gain of substantially 1/Gm, and the high-pass component of the current signal $I_{SIG}$ is converted to the voltage $V_1$ by a gain of substantially ro. Since ro>1/Gm as described above, the signal voltage becomes the voltage $V_1$ obtained by amplifying the high-pass component of the current signal $I_{SIG}$ more than the low-pass component thereof.

In contrast, the reference voltage to be inputted into the positive input terminal of the comparator Com is expressed by the following expression:

$$V_2(s)+V_{th}=I(s)ro/(1+Gm \cdot ro+s/\omega c)+V_{th} \qquad (2)$$

It is found from Expression (2) above that the low-pass component of the current signal $I_{SIG}$ is converted to the voltage $V_2$ by a gain of substantially 1/Gm, and the high-pass component of the current signal $I_{SIG}$ is converted to the voltage $V_2$ by a gain smaller than 1/Gm.

In this signal detection circuit, the voltage $V_1$ obtained by converting the current signal $I_{SIG}$ as emphasizing its high-pass component and a voltage $V_2+V_{th}$ obtained by converting the current signal $I_{SIG}$ as suppressing its high-pass component are compared by the comparator Com, to detect a signal component included in the current signal $I_{SIG}$. At the time of inputting the signal component, a larger amount of high-pass component is included and a difference between the voltage $V_1$ and the voltage $V_2+V_{th}$ is emphasized. Accordingly, even when the current signal $I_{SIG}$ is small, the signal component can be accurately detected.

Further, since the reference voltage $V_2+V_{th}$ that is compared with the input voltage $V_1$ is generated from the current signal $I_{SIG}$, it fluctuates based on fluctuations in input frequency of the current signal $I_{SIG}$ including the signal component. Therefore, even when the current signal $I_{SIG}$ including the signal component is irregularly inputted and a DC component of the current signal $I_{SIG}$ fluctuates, the reference voltage fluctuates following the DC component. Accordingly, even when the current signal $I_{SIG}$ including the signal component is irregularly inputted, the signal detection circuit can accurately detect the signal component.

Further, since this signal detection circuit can arbitrarily set a threshold voltage $V_{th}$ for determining whether or not the signal component has been inputted by the level shift circuit LS, it can reduce erroneous detection caused by fluctuations in DC component of the current signal $I_{SIG}$ or an input offset of the comparator Com.

The use of the signal detection circuit 6 as in FIG. 4 enables accurate detection of the signal component, thus leading to the accurate timing for starting the integration operation. Hence it is possible to improve the accuracy in integration of the integration circuit.

Figure 6:
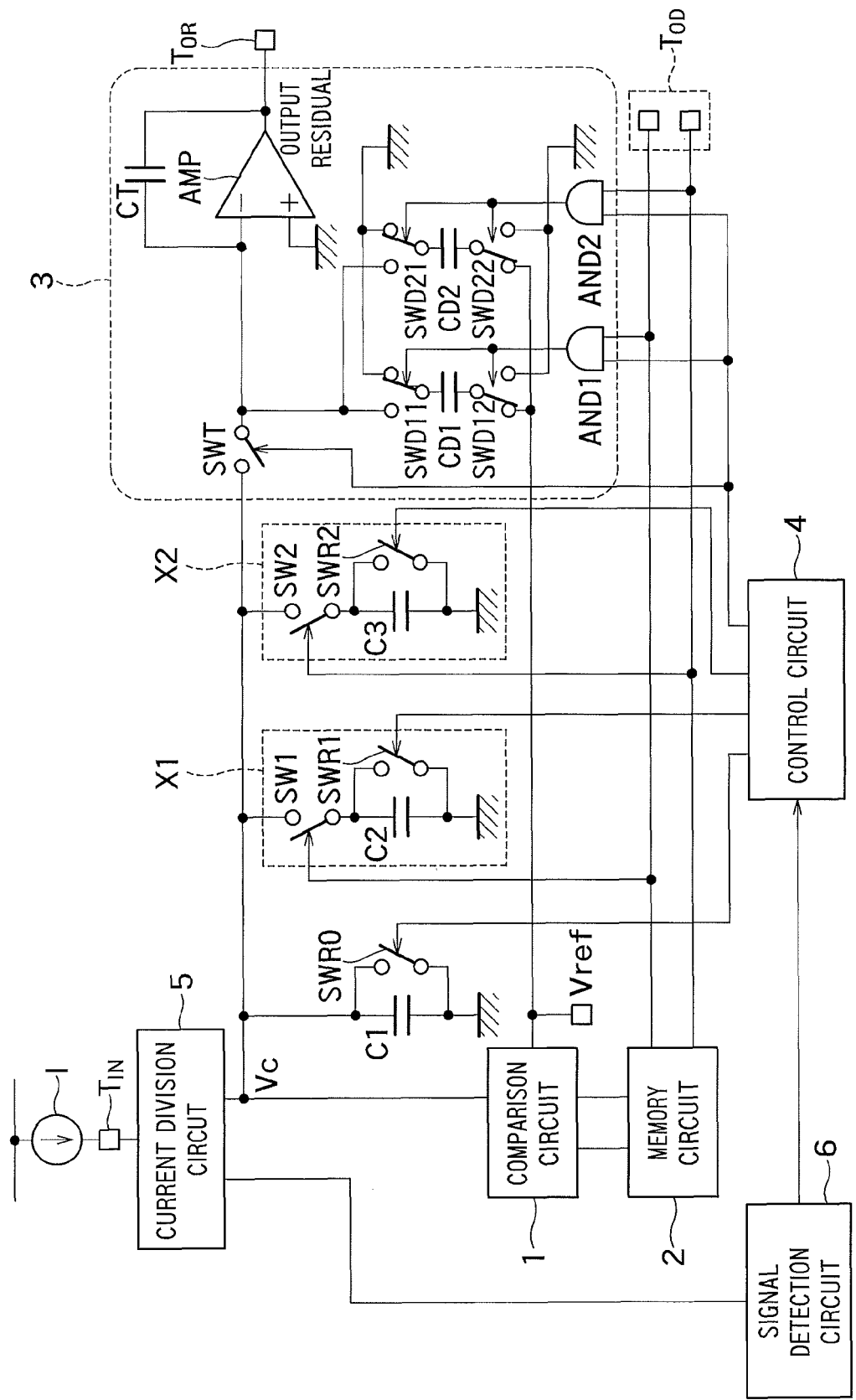
FIG. 6 is a diagram showing one example of a residual operation circuit of FIG. 4.

FIG. 6 is a diagram showing one example of the residual operation circuit 3 of the integration circuit according to the present embodiment. As shown in FIG. 6, this residual operation circuit 3 is provided with capacitance elements CD1, CD2, switches SWD11, SWD12, SWD21, SWD22, SWT, an amplifier circuit AMP, the capacitance element CT, and AND circuits AND1, AND2. The foregoing charge generation circuit 31 and subtraction circuit 32 are configured of the capacitance elements CD1, CD2, the switches SWD11, SWD12, SWD21, SWD22, SWT, the amplifier circuit AMP, and the AND circuits AND1, AND2. A function of each of them is realized by switching of the switches SWD11, SWD12, SWD21, SWD22.

The amplifier circuit AMP is connected in parallel to the capacitance element CT, and transmits the electric charges stored in the capacitance elements C1 to C3 to the capacitance element CT by negative feedback. An output terminal of the amplifier circuit AMP is connected to the residual output terminal $T_{OR}$.

The switch SWT is a switch that connects to or opens between the capacitance element C1, the capacitance circuits X1, X2 and the residual operation circuit 3, and is opened or closed by means of the residual calculation start signal from the control circuit 4. The switch SWT is turned on when the residual calculation start signal is H, and is turned off when the residual calculation start signal is L.

The capacitance element CD1 generates an electric charge based on the first comparison result of the comparison circuit 1, and stores the generated electric charge. One end of the capacitance element CD1 is connected to the switch SWD11, and the other end thereof is connected to the switch SWD12.

The switches SWD11, SWD12 are switchable switches. The switch SWD11 connects one end of the capacitance element CD1 to the ground or the capacitance element CT. The switch SWD12 connects the other end of the capacitance element CD1 to a voltage source of the reference voltage Vref or the ground. The SWD11, SWD12 can switch the connection by means of a switching signal from the AND circuit AND1.

The AND circuit AND1 receives an input of the first comparison result from the memory circuit 2, receives an input of the residual calculation start signal from the control circuit 4, and outputs the switching signal (H or L) for switching the connection between the switches SWD11 and SWD12. Specifically, the AND circuit AND1 outputs the switching signal H when the first comparison result is H and the residual calculation start signal is H, and in other cases, the AND circuit AND1 outputs L as the switching signal.

When the switching signal of the AND circuit AND1 is L, the capacitance element CD1 is connected to between the voltage source of the reference voltage Vref and the ground by the switches SWD11, SWD12. Therefore, in the capacitance element CD1, an electric charge based on the reference voltage Vref and a capacitance CD1 of the capacitance element CD1 is generated and stored. Thereby, the function of the charge generation circuit 31 is realized.

When the switching signal of the AND circuit AND1 is H, the capacitance element CD1 is connected to between the capacitance element CT and the ground by the switches SWD11, SWD12. Since an electric charge of −Vref×CD1 is stored into one end of the capacitance element CD1 while the switching signal is L, when the switching signal becomes H, an electric charge of Vref×CD1 is extracted from the capacitance element CT. Thereby, the function of the subtraction circuit 32 is realized.

The capacitance element CD2 generates an electric charge based on the second comparison result of the comparison circuit 1, and stores the generated electric charge. One end of the capacitance element CD2 is connected to the switch SWD21, and the other end thereof is connected to the switch SWD22.

The switches SWD21, SWD22 are switchable switches. The switch SWD21 connects one end of the capacitance element CD2 to the ground or the capacitance element CT. The switch SWD22 connects the other end of the capacitance element CD2 to the voltage source of the reference voltage Vref or the ground. The switches SWD21, SWD22 can switch the connection by means of a switching signal from the AND circuit AND2.

The AND circuit AND2 receives an input of the second comparison result from the memory circuit 2, receives an input of the residual calculation start signal from the control circuit 4, and outputs the switching signal (H or L) for switching the connection between the switches SWD21 and SWD22. Specifically, the AND circuit AND2 outputs the switching signal H when the second comparison result is H and the residual calculation start signal is H, and in other cases, the AND circuit AND2 outputs L as the switching signal.

When the switching signal of the AND circuit AND2 is L, the capacitance element CD2 is connected to between the voltage source of the reference voltage Vref and the ground by the switches SWD21, SWD22. Therefore, in the capacitance element CD2, an electric charge based on the reference voltage Vref and a capacitance CD2 of the capacitance element CD2 is generated and stored. Thereby, the function of the charge generation circuit 31 is realized.

When the switching signal of the AND circuit AND2 is H, the capacitance element CD2 is connected to between the capacitance element CT and the ground by the switches SWD21, SWD22. Since an electric charge of −Vref×CD2 is stored into one end of the capacitance element CD2 while the switching signal is L, when the switching signal becomes H, an electric charge of Vref×CD2 is extracted from the capacitance element CT. Thereby, the function of the subtraction circuit 32 is realized.

In this residual operation circuit 3, when the signal detection circuit 6 detects a signal component and the control circuit 4 receives an input of the detection signal, the integration of the current signal $I_{SIG}$ is started by the capacitance elements C1 to C3. Then, when the predetermined time $t_1$ elapses, H is outputted from the control circuit 4 as the residual calculation start signal. Thereby, the switch SWT is turned on. Further, when the first comparison result is H, the switching signal of the AND circuit AND1 becomes H, and the capacitance element CD1 is connected to the capacitance element CT. Moreover, when the second comparison result is H, the switching signal of the AND circuit AND2 becomes H, and the capacitance element CD2 is connected to the capacitance element CT.

Thereby, the electric charge is transmitted from the capacitance elements C1 to C3 to the capacitance element CT, and the electric charge based on the comparison result is extracted from the capacitance element CT to the capacitance elements CD1, CD2. The remaining electric charge is left in the capacitance element CT, and the voltage $V_R$ of the capacitance element CT is outputted as the residual signal. Thereby, the residual calculation is realized.

Figure 7:
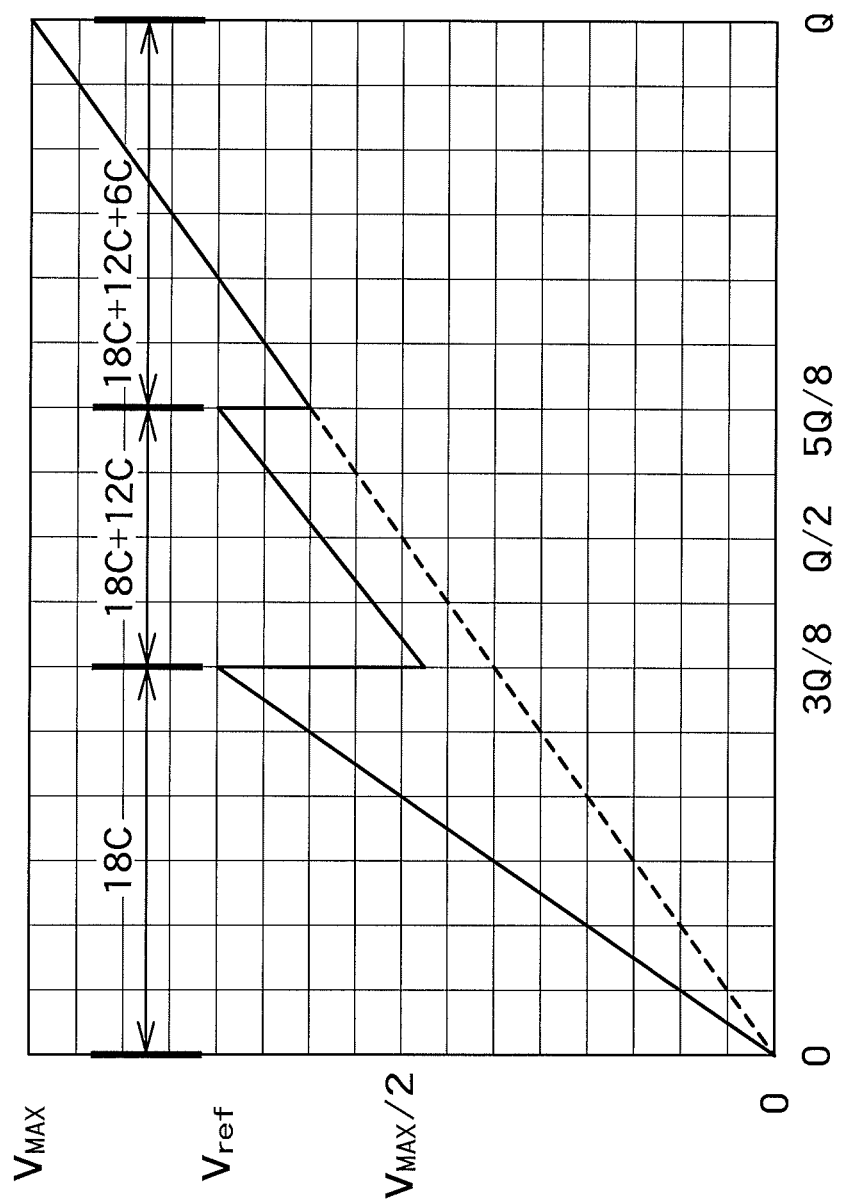
FIG. 7 is a diagram showing the relation between an integrated value and a voltage of an integration capacitor.

Here, FIG. 7 is a diagram showing the relation between the integrated value and the voltage Vc in this integration circuit. The above integrated value is an amount of the electric charges stored in the capacitance elements C1 to C3. In FIG. 7, a horizontal axis indicates the integrated value, a vertical axis indicates the voltage Vc of the capacitance element C1, and character Q denotes an integrated value at the time of input of the maximum current signal $I_{SIG}$. At this time, $Q=V_{MAX}\times(C1+C2+C3)$. It is assumed that the reference voltage Vref is set to: $Vref=V_{MAX}\times 3/4$, and the capacitances of the capacitance elements C1 to C3 are respectively set to C1=18C (F), C2=12C(F) and C3=6C(F). Here, C represents a predetermined capacitance.

When the current signal $I_{SIG}$ is inputted into the integration circuit set as thus described, first, an electric charge is stored into the capacitance element C1 by means of the current signal $I_{SIG}$, and the voltage Vc increases. When an electric charge of Q×3/8 is stored into the capacitance element C1, the voltage Vc becomes: Vc=Vref, and the comparison circuit 1 outputs H as a comparison result. The memory circuit 2 stores H as the first comparison result, outputs H to the switch SW1 as the opening/closing signal, and turns on the switch SW1. Thereby, the electric charge (=Q×3/8) stored in the capacitance element C1 is redistributed to the capacitance elements C1, C2, and the voltage Vc decreases to $V_{MAX}\times 9/20$.

Subsequently, the electric charge is stored into the capacitance elements C1, C2, and the voltage Vc increases again. When an electric charge of Q×5/8 is stored into the capacitance elements C1, C2, the voltage Vc becomes: Vc=Vref again, and the comparison circuit 1 outputs H as a comparison result. The memory circuit 2 stores H as the second comparison result, outputs H to the switch SW2 as the opening/closing signal, and turns on the switch SW2. Thereby, the electric charge (=Q×5/8) stored in the capacitance elements C1, C2 is redistributed to the capacitance elements C1 to C3, and the voltage Vc decreases to $V_{MAX}\times 5/8$.

Thereafter, the capacitance elements C1 to C3 continue to integrate the current signal $I_{SIG}$. Since the integration circuit of FIG. 6 is configured to perform the 1.5-bit A/D conversion, the number of times of comparison is up to two, and even when the voltage Vc exceeds the reference voltage Vref, the integration circuit continues the integration in a range of $Vc \leq V_{MAX}$.

In this integration circuit, an electric charge based on the comparison result is extracted from the electric charge (integrated value) stored in the capacitance elements C1 to C3, and the remaining electric charge is left in the capacitance element CT. Then, the voltage $V_R$ of the capacitance element CT that is generated by the remaining electric charge becomes the residual signal.

Figure 8:
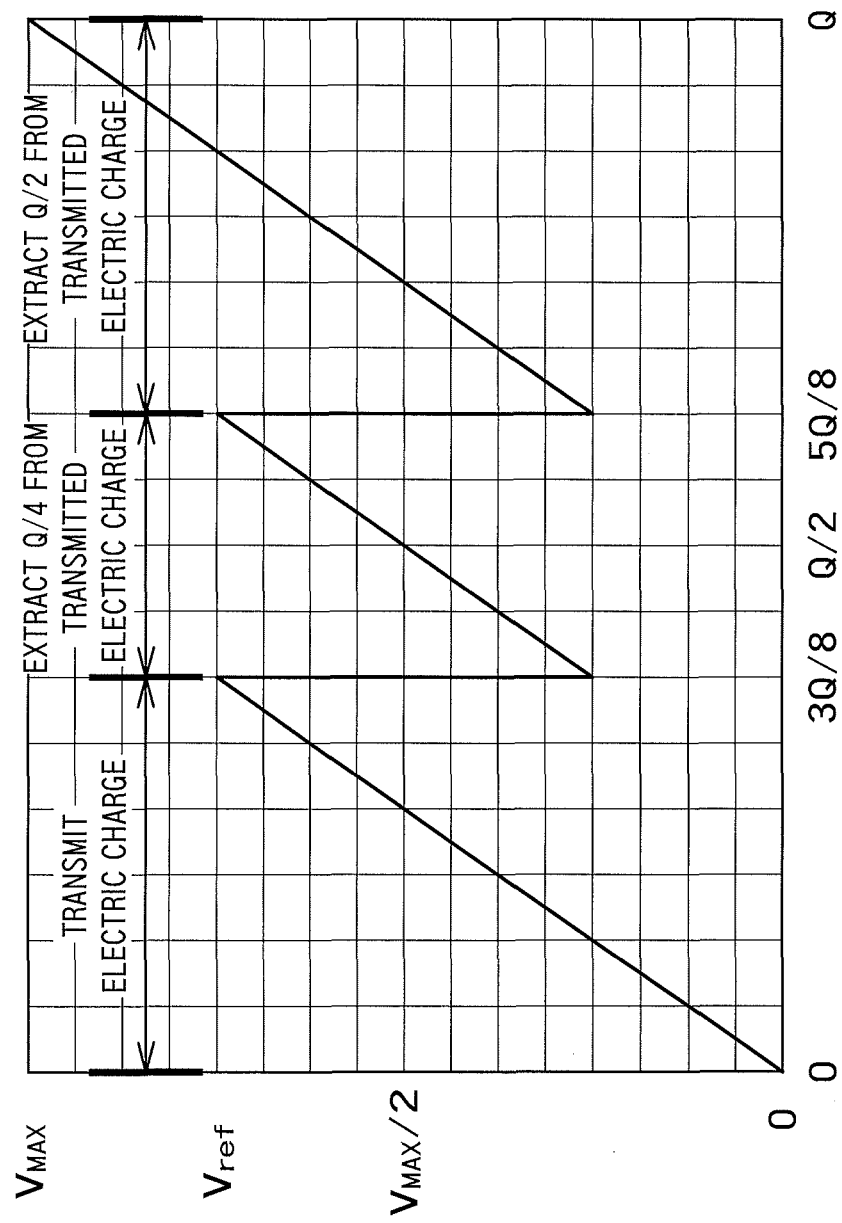
FIG. 8 is a diagram showing the relation between the integrated value and an output voltage.

Here, FIG. 8 is a diagram showing the relation between the integrated value and the voltage $V_R$ in this integration circuit. In FIG. 8, a horizontal axis indicates the integrated value and a vertical axis indicates the voltage $V_R$ after residual calculation. It is assumed that, the capacitance of the capacitance element CT is set to CT=18C(F) such that the voltage $V_R$ is: $VR=V_{MAX}$ when the maximum current signal $I_{SIG}$ is inputted.

Realizing the 1.5-bit A/D conversion requires subtraction of the electric charge from the integrated value such that the voltage $V_R$ after the residual calculation is constantly a predetermined voltage. In the case of FIG. 8, the residual calculation is respectively performed when the integrated value is Q×3/8 and Q×5/8, but in either case, the voltage $V_R$ after the residual calculation is constantly: $VR=V_{MAX}/4$. It is to be noted that the voltage $V_R$ after the residual calculation can be arbitrarily set to $VR=V_{MAX}/4$, but it is preferably set to a value larger than 0. This can suppress an influence by offsetting of the electric charges stored in the capacitance elements C1 to C3, CT, CD1, CD2.

In FIG. 8, when the integrated value is smaller than Q×3/8, namely when the voltage Vc does not agree with the reference voltage Vref even once, the residual calculation is not performed. When the integrated value is not smaller than Q×3/8 and smaller than Q×5/8, namely when the voltage Vc agrees with the reference voltage Vref just once, the residual operation circuit 3 subtracts an electric charge of Q/4 from the integrated value. When the integrated value is not smaller than Q×5/8, namely when the voltage Vc agrees with the reference voltage Vref twice, the residual operation circuit 3 subtracts an electric charge of Q/2 from the integrated value.

Such subtraction of the electric charge as described above can be realized by setting the capacitances of the capacitance elements CD1, CD2 to: CD1=CD2=12C (F). Hence, Vref×CD1=Vref×CD2=$V_{MAX}\times 3/4\times 12C=Q/4$. Accordingly, when the voltage Vc agrees with the reference voltage Vref just once, an electric charge of Q/4 stored in the capacitance element CD1 is subtracted, and when the voltage Vc agrees with the reference voltage Vref twice, an electric charge of Q/2(Q/4+Q/4) stored in the capacitance elements CD1, CD2 is subtracted.

Figure 9:
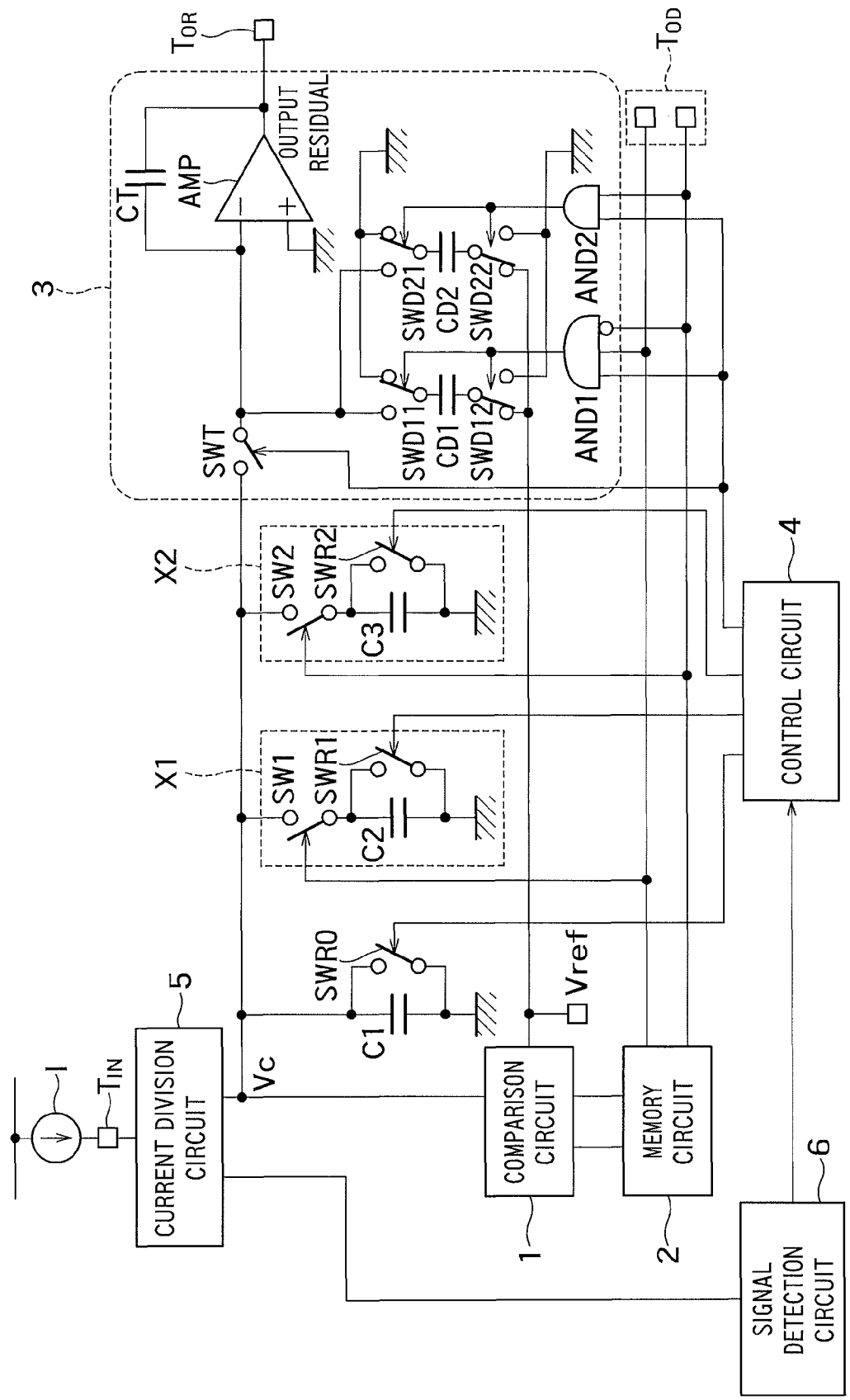
FIG. 9 is a diagram showing another example of a residual operation circuit of FIG. 4.

It should be noted that the residual operation circuit 3 of FIG. 6 has a configuration where the electric charges stored in both the capacitance elements CD1, CD2 are subtracted when the voltage Vc agrees with the reference voltage Vref twice, but it may have a configuration where only the electric charge in the capacitance element CD2 is subtracted. In this case, as shown in FIG. 9, the second comparison result may be reversed and inputted into the AND circuit AND1, and the capacitance of the capacitance element CD2 may be set to: CD2=24C(F).

Fourth Embodiment

Figure 10:
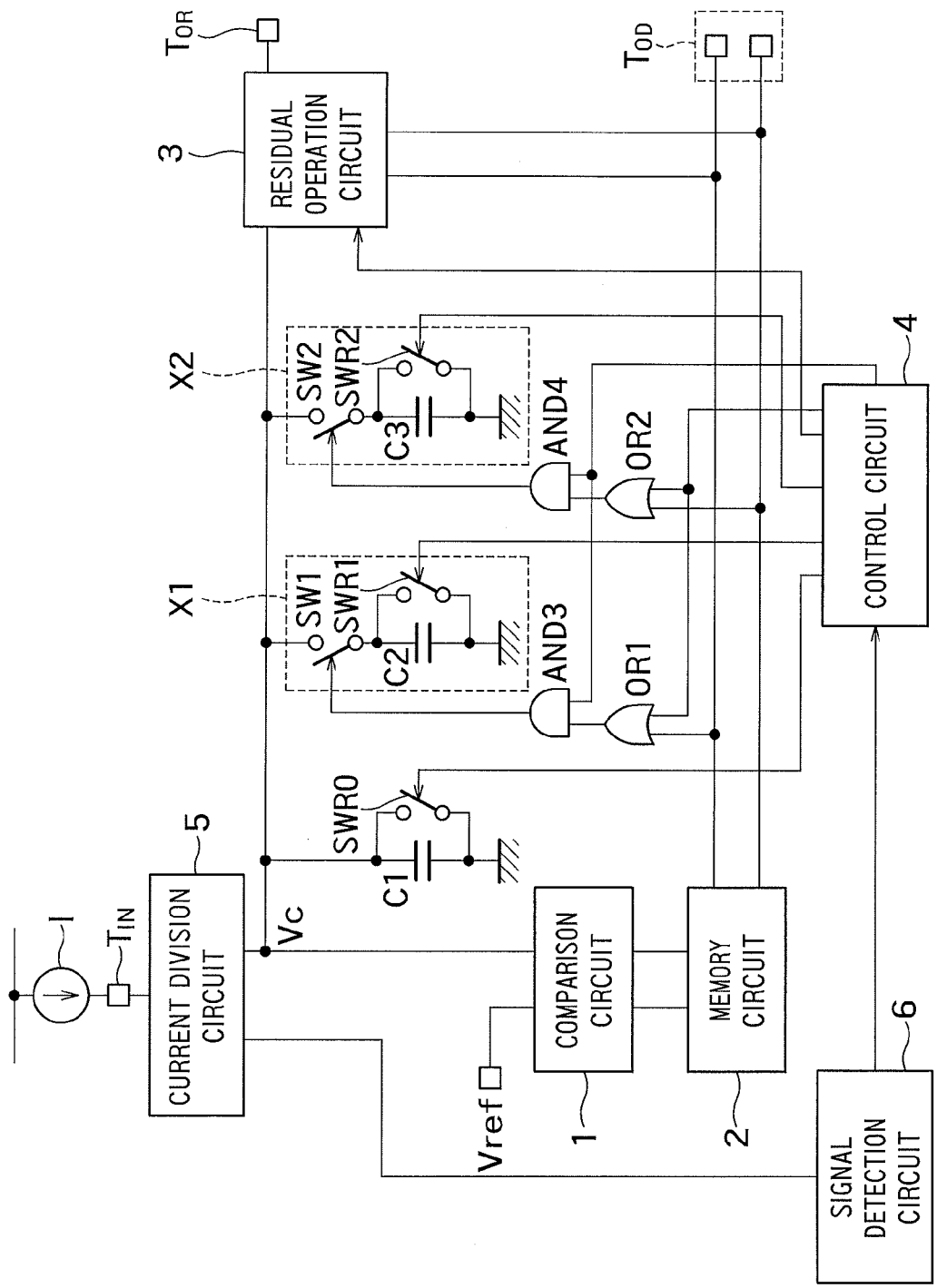
FIG. 10 is a schematic constitutional view showing an integration circuit according to a fourth embodiment.

Next, an integration circuit according to a fourth embodiment will be described with reference to FIG. 10. FIG. 10 is a schematic constitutional view showing the integration circuit according to the present embodiment. As shown in FIG. 10, the integration circuit according to the present embodiment is provided with an AND circuit AND3, an AND circuit AND4, an OR circuit OR1 and an OR circuit OR2. The other configurations are similar to those in the third embodiment. In the integration circuit of the present embodiment, the switches SW1, SW2 are turned on after a predetermined time $t_3$ (second predetermined time) ($<t_1$) from the start of integration of the current signal $I_{SIG}$, and the electric charges stored in the capacitance elements C1 to C3 are redistributed. Then, the predetermined time $t_1$ later, the switches SW1, SW2 are turned off, and the residual calculation is started.

The OR circuit OR1 receives an input of the first comparison result obtained by the comparison circuit 1 from the memory circuit 2, receives an input of the redistribution start signal from the control circuit 4, and outputs the output signal (H or L). Specifically, the OR circuit OR1 outputs H as the output signal when H is inputted as at least one of the first comparison result and the redistribution start signal, and in other cases, the OR circuit OR1 outputs L as the output signal. The redistribution start signal is a signal that becomes H after the predetermined time $t_3$ from the detection of the signal by the signal detection circuit 6.

The AND circuit AND3 receives an input of the output signal of the OR circuit OR1, receives an input of an integration signal from the control circuit 4, and outputs the opening/closing signal to the switch SW1. The integration signal is a signal that becomes H when the signal component is detected, and the predetermined time $t_1$ later, becomes L. The AND circuit AND3 outputs H when the output signal of the OR circuit OR1 is H and the integration signal is H, and in other cases, the AND circuit AND3 outputs L.

The OR circuit OR2 receives an input of the second comparison result obtained by the comparison circuit 1 from the memory circuit 2, receives an input of the redistribution start signal from the control circuit 4, and outputs the output signal (H or L). Specifically, the OR circuit OR2 outputs H as the output signal when H is inputted as at least one of the second comparison result and the redistribution start signal, and in other cases, the OR circuit OR2 outputs L as the output signal.

The AND circuit AND4 receives an input of the output signal of the OR circuit OR2, receives an input of the integration signal from the control circuit 4, and outputs the opening/closing signal to the switch SW2. The AND circuit AND4 outputs H when the output signal of the OR circuit OR2 is H and the integration signal is H, and in other cases, the AND circuit AND4 outputs L.

In this integration circuit, when the signal detection circuit 6 detects the signal component, the integration signal becomes H, and the integration of the current signal $I_{SIG}$ is started. When the voltage Vc agrees with the reference voltage Vref for the first time, the first comparison result becomes H, the OR circuit OR1 outputs H, and the opening/closing signal of the AND circuit AND3 becomes H. Thereby, the switch SW1 is turned on, to start the integration by the capacitance elements C1, C2. Similarly, when the voltage Vc agrees with the reference voltage Vref for the second time, the second comparison result becomes H, the OR circuit OR2 outputs H, and the opening/closing signal of the AND circuit AND4 becomes H. Thereby, the switch SW2 is turned on, to start the integration by the capacitance elements C1 to C3. The operation up to now is similar to those in the foregoing embodiments.

Thereafter, when the predetermined time $t_3$ elapses from the detection of the signal, the redistribution start signal becomes H. Accordingly, regardless of the comparison result, outputs of both the OR circuit OR1 and the OR circuit OR2 become H, and outputs of both the AND circuit AND3 and the AND circuit AND4 become H. Hence both the switches SW1, SW2 are turned on. The electric charges stored in each capacitance element are redistributed to the capacitance elements C1 to C3 by turning-on of both the switches SW1, SW2.

Subsequently, when the predetermined time $t_1$ elapses from the detection of the signal, the integration signal becomes L, and the outputs of the AND circuits AND3, AND4 become L. Thereby, the switches SW1, SW2 are turned off. Further, the residual calculation start signal becomes H, and the residual calculation is started. Therefore, the residual calculation is performed by the electric charge stored in the capacitance element C1 after the redistribution.

As described above, according to the integration circuit of the present embodiment, the residual calculation can be performed by the electric charge stored in the capacitance element C1 after the redistribution. Since the electric charge used for the residual calculation has become C1/(C1+C2+C3) times as large as before the redistribution, the electric charge generated by the charge generation circuit 31 for the residual calculation is also C1/(C1+C2+C3) times as large. Therefore, it is possible to cut the capacitances of the capacitance elements CD1, CD2 down to C1/(C1+C2+C3) times as large, so as to reduce a circuit area of the integration circuit.

Fifth Embodiment

Figure 11:
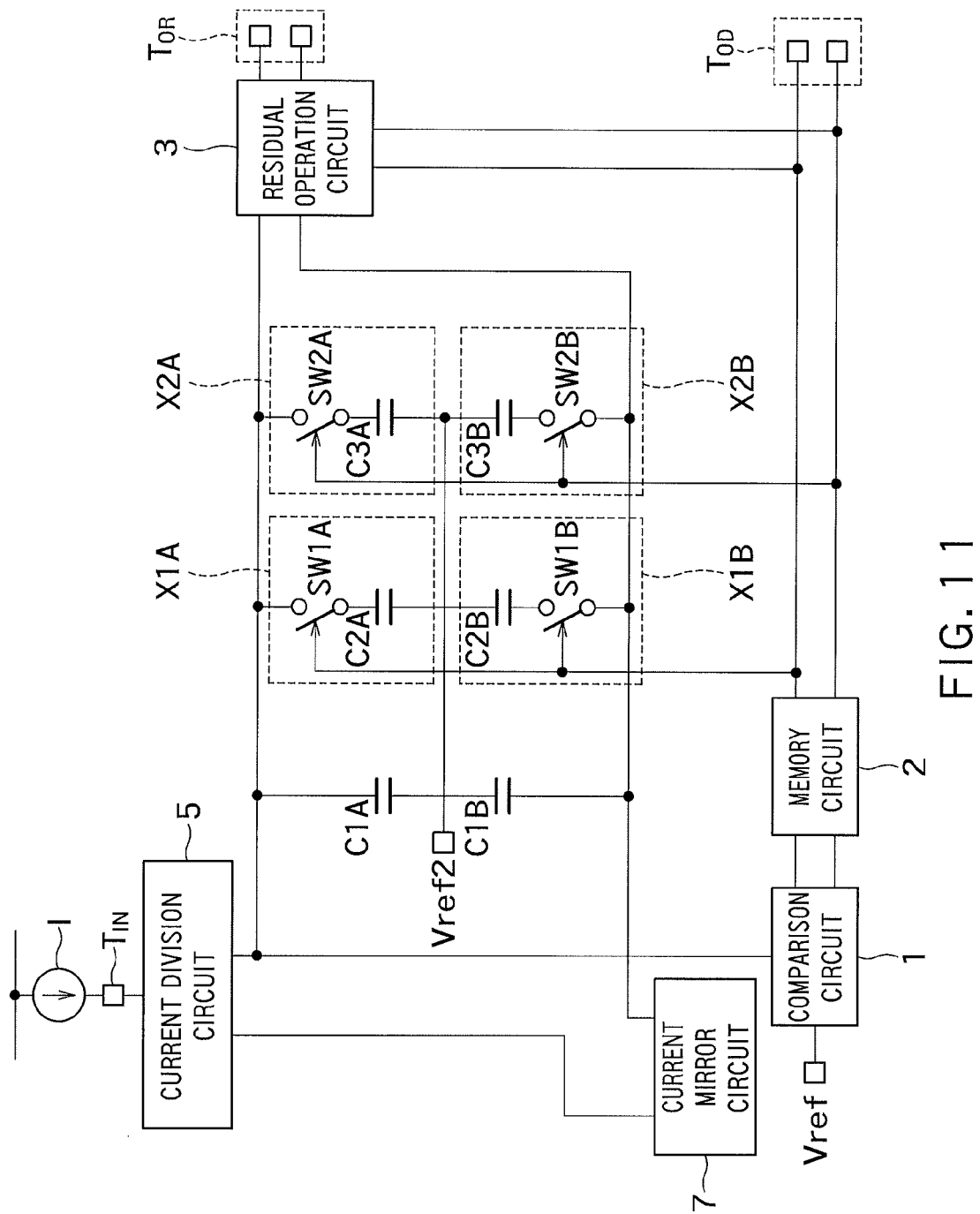
FIG. 11 is a schematic constitutional view showing an integration circuit according to a fifth embodiment.

Next, an integration circuit according to a fifth embodiment will be described with reference to FIGS. 11 and 12. FIG. 11 is a schematic constitutional view showing the integration circuit according to the present embodiment. As shown in FIG. 11, the integration circuit according to the present embodiment is provided with a capacitance element C1B, capacitance circuits X1B, X2B, the current division circuit 5, and a current mirror circuit 7. The other configurations are similar to those in the first embodiment.

It is to be noted that a capacitance element C1A and capacitance circuits X1A, X2A in FIG. 11 have the same configurations as those of the capacitance element C1 and the capacitance circuits X1, X2 in FIG. 1. In FIG. 1, the other ends of the capacitance elements C1, C2, C3 are connected to the ground, but in the present embodiment, the other ends of the capacitance elements C1A, C2A, C3A are connected to a voltage source of a reference voltage Vref2. The current division circuit 5 is as described in the third embodiment.

The current mirror circuit 7 is connected to between the capacitance element C1B, the capacitance circuits X1B, X2B and the current division circuit 5, duplicates the current signal $I_{SIG}$ divided by the current division circuit 5 and outputs the duplicated current.

One end of the capacitance element C1B (fourth capacitance element) is connected to the current mirror circuit 7, and the other end thereof is connected to the other end of the capacitance element CIA. Therefore, the reference voltage Vref2 is applied to the other ends of the capacitance elements CIA, C1B. The current signal $I_{SIG}$ mirrored by the current mirror circuit 7 is inputted into the capacitance element C1B.

The capacitance circuit X1B is connected in parallel to the capacitance element C1B, and is provided with a switch SW1B and a capacitance element C2B. The switch SW1B (third switch) is connected to between the current mirror circuit 7 and the capacitance element C2B. Opening/closing of the switch SW1B is controlled by means of a similar opening/closing signal to that for the switch SW1A. One end of the capacitance element C2B (fifth capacitance element) is connected to the switch SW1B, and the other end thereof is connected to the other end of the capacitance element C2A. Accordingly, the reference voltage Vref2 is applied to the other ends of the capacitance elements C2A, C2B. The current signal $I_{SIG}$ mirrored by the current mirror circuit 7 is inputted into the capacitance element C2B.

The capacitance circuit X2B is connected in parallel to the capacitance element C1B, and is provided with a switch SW2B and a capacitance element C3B. The switch SW2B (fourth switch) is connected to between the current mirror circuit 7 and the capacitance element C3B. Opening/closing of the switch SW2B is controlled by means of a similar opening/closing signal to that for the switch SW2A. One end of the capacitance element C3B (fifth capacitance element) is connected to the switch SW2B, and the other end thereof is connected to the other end of the capacitance element C3A. Accordingly, the reference voltage Vref2 is applied to the other ends of the capacitance elements C3A, C3B. The current signal $I_{SIG}$ mirrored by the current mirror circuit 7 is inputted into the capacitance element C3B.

In the present embodiment, the residual operation circuit 3 separately outputs the residual signal based on the integrated value obtained by the capacitance elements C1A to C3A and the residual signal based on the integrated value obtained by the capacitance elements C1B to C3B. Therefore, as shown in FIG. 11, this integration circuit is provided with two residual output terminals $T_{OR}$.

With such a configuration, in the integration circuit according to the present embodiment, it is possible to output the residual signal as a differential signal with the common-mode voltage of the voltage Vref2.

Figure 12:
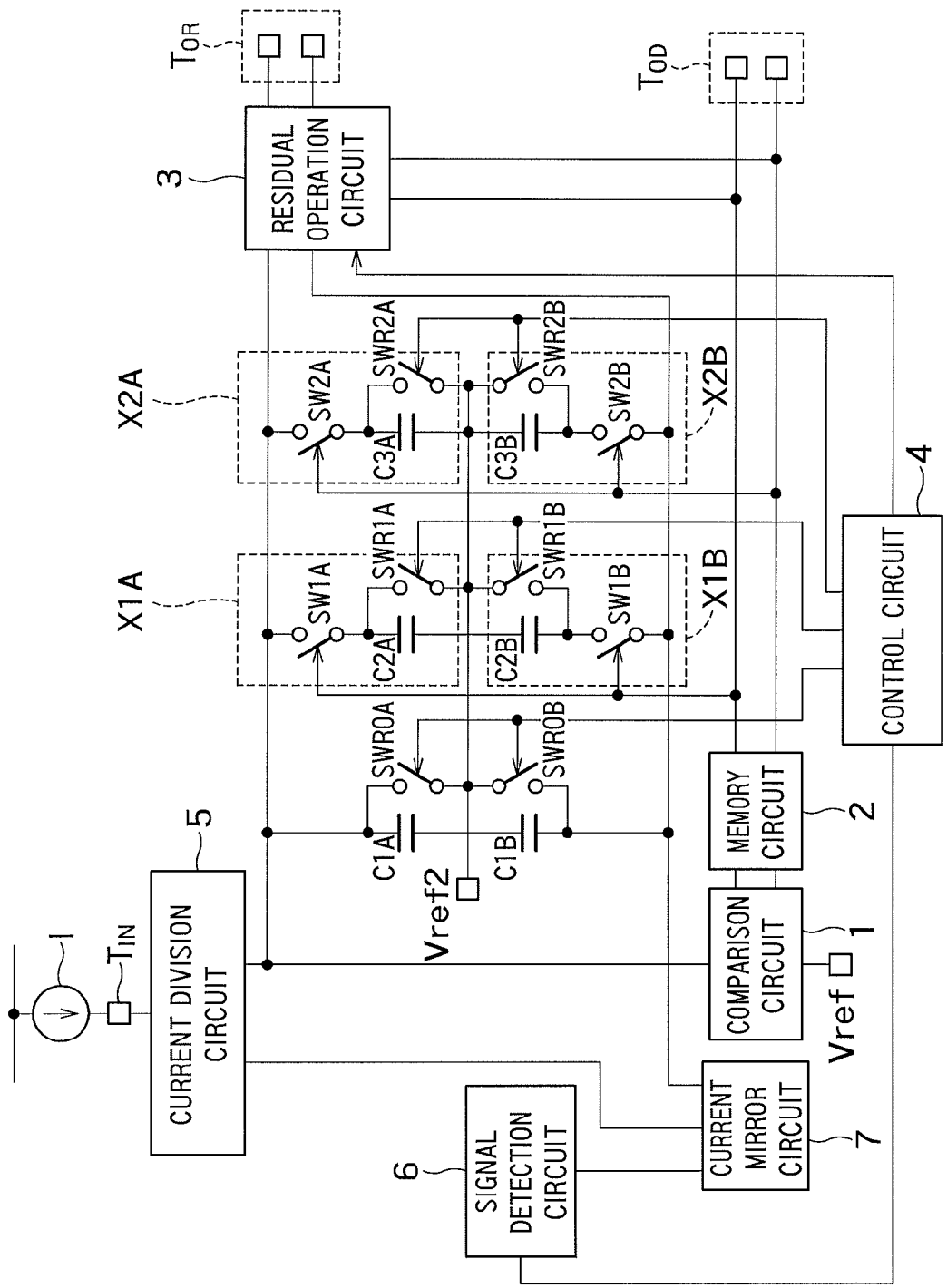
FIG. 12 is a diagram showing another example of the integration circuit of FIG. 11.

FIG. 12 is a diagram showing another example of the integration circuit according to the present embodiment. The integration circuit of FIG. 12 is further provided with the control circuit 4 and the signal detection circuit 6. In this integration circuit, two types of outputs of the current mirror circuit 7 are provided. The one is connected to a differential side, namely the capacitance element C1B and the capacitance circuits X1B, X2B, and the other is connected to the signal detection circuit 6.

With such a configuration, it is possible to detect the signal component, and is also possible to input the current signal $I_{SIG}$ inputted from the current division circuit 5, into the differential side without reducing it, and integrate the inputted current signal. Hence it is possible to suppress deterioration in signal to noise ratio due to reduction in current signal $I_{SIG}$.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An integration circuit comprising:
a first capacitance element configured to receive a current signal;
a capacitance circuit comprising a first switch and a second capacitance element configured to receive the current signal via the first switch, and connected in parallel to the first capacitance element;
a comparison circuit configured to compare a voltage of the first capacitance element with a reference voltage to obtain a comparison result;
a memory circuit configured to store the comparison result and open or close the first switch based on the comparison result; and
an operation circuit configured to output a residual signal based on a difference between an integrated value obtained by the first capacitance element and the second capacitance element and a value based on the comparison result stored in the memory circuit.

2. The circuit according to claim 1, comprising
one or more additional capacitance circuits,
wherein, when the voltage of the first capacitance element and the reference voltage agree for an N-th (1≤N) time, the memory circuit turns on the first switch of the N-th capacitance circuit.

3. The circuit according to claim 1,
wherein the operation circuit comprises:
a generation circuit configured to generate an electric charge based on the comparison result;
a subtraction circuit configured to output an electric charge based on a difference between electric charges stored in the first capacitance element and the second capacitance element and the electric charge generated by the generation circuit; and
a third capacitance element to output a voltage based on the electric charge output by the subtraction circuit.

4. The circuit according to claim 1, further comprising:
a second switch configured to discharge electric charges stored in the first capacitance element and the second capacitance element; and
a control circuit configured to open or close the second switch.

5. The circuit according to claim 4, further comprising
a detection circuit configured to detect a signal component included in the current signal,
wherein the control circuit turns on the second switch after a first time period passes after the detection circuit detects the signal component.

6. The circuit according to claim 5,
wherein the detection circuit comprises
a signal input terminal,
a low-pass filter having a first terminal and a second terminal, the signal input terminal connected to the first terminal,
a voltage-to-current conversion circuit having a first terminal connected to the second terminal of the low-pass filter and a second terminal connected to the signal input terminal,
a comparator having a first terminal connected to the second terminal of the low-pass filter and a second terminal connected to the second terminal of the voltage-to-current conversion circuit, the comparator configured to output a signal based on a difference between a signal input at the first terminal of the comparator and a signal input at the second terminal of the comparator, and a level shift circuit connected between the second terminal of the low-pass filter and the first terminal of the comparator.

7. The circuit according to claim 5, wherein the control circuit turns on the first switch after a second time period passes after the detection circuit detects the signal component.

8. The circuit according to claim 1, further comprising:

a current mirror circuit configured to duplicate the current signal;

a fourth capacitance element configured to receive the current signal mirrored by the current mirror circuit;

and a capacitance circuit comprising a fifth capacitance element configured to receive the current signal mirrored by the current mirror circuit via a third switch, and connected in parallel to the fourth capacitance element.

9. The circuit according to claim 8, further comprising a detection circuit configured to detect a signal component included in the current signal, wherein the detection circuit receives the current signal mirrored by the current mirror circuit.

* * * * *